(12) United States Patent
Peake et al.

(10) Patent No.: US 10,153,365 B2
(45) Date of Patent: Dec. 11, 2018

(54) SEMICONDUCTOR DEVICE AND A METHOD OF MAKING A SEMICONDUCTOR DEVICE

(71) Applicant: Nexperia B.V., AB Nijmegen (NL)

(72) Inventors: Steven Thomas Peake, Warrington (GB); Philip Rutter, Stockport (GB); Chris Rogers, Hazelgrove (GB)

(73) Assignee: Nexperia B.V., Nijmegen (NL)

( * ) Notice: Subject to any disclaimer, the term of this patent is extended or adjusted under 35 U.S.C. 154(b) by 0 days.

(21) Appl. No.: 15/233,834

(22) Filed: Aug. 10, 2016

(65) Prior Publication Data
US 2017/0077291 A1    Mar. 16, 2017

(30) Foreign Application Priority Data
Sep. 11, 2015   (EP) ...................................... 15184799

(51) Int. Cl.
*H01L 29/78*   (2006.01)
*H01L 29/40*   (2006.01)
*H01L 29/66*   (2006.01)
*H01L 29/08*   (2006.01)
(Continued)

(52) U.S. Cl.
CPC .... *H01L 29/7813* (2013.01); *H01L 21/26513* (2013.01); *H01L 29/063* (2013.01); *H01L 29/0878* (2013.01); *H01L 29/407* (2013.01); *H01L 29/66734* (2013.01)

(58) Field of Classification Search
CPC ............ H01L 29/0634; H01L 29/1095; H01L 29/402; H01L 29/063; H01L 27/0288
See application file for complete search history.

(56) References Cited

U.S. PATENT DOCUMENTS

| 5,998,833 A | 12/1999 | Baliga |
| 2005/0133858 A1* | 6/2005 | Banerjee ............. H01L 29/0878 257/327 |
| 2006/0214221 A1 | 9/2006 | Challa et al. |

(Continued)

FOREIGN PATENT DOCUMENTS

EP    1 271 655 A2    1/2003

OTHER PUBLICATIONS

Extended European Search Report for Patent Appln. No. 15184799.3 (dated Mar. 11, 2016).

*Primary Examiner* — Julia Slutsker
(74) *Attorney, Agent, or Firm* — Ohlandt, Greeley, Ruggiero & Perle, L.L.P.

(57) ABSTRACT

A semiconductor device and a method of making a semiconductor device. The device includes a semiconductor substrate having a first conductivity type, a layer of doped silicon located on the substrate, a trench extending into the layer of silicon, and a gate electrode and gate dielectric located in the trench. The device also includes a drain region, a body region having a second conductivity type located adjacent the trench and above the drain region, and a source region having the first conductivity type located adjacent the trench and above the body region. The layer of doped silicon in a region located beneath the body region includes donor ions and acceptor ions forming a net doping concentration within said region by compensation. The net doping concentration of the layer of doped silicon as a function of depth has a minimum in a region located immediately beneath the body region.

9 Claims, 6 Drawing Sheets

(51) Int. Cl.
*H01L 21/265* (2006.01)
*H01L 29/06* (2006.01)

(56) References Cited

U.S. PATENT DOCUMENTS

2008/0230833 A1    9/2008  Zundel et al.
2013/0062688 A1*   3/2013  Kobayashi ............ H01L 29/407
                                                257/330
2015/0097233 A1    4/2015  Zundel et al.

* cited by examiner

SEMICONDUCTOR DEVICE AND A METHOD OF MAKING A SEMICONDUCTOR DEVICE

CROSS-REFERENCE TO RELATED APPLICATIONS

This application claims the priority under 35 U.S.C. § 119 of European Patent application no. 15184799.3, filed on Sep. 11, 2015, the contents of which are incorporated by reference herein.

BACKGROUND

The present specification relates to a semiconductor device and a method of making a semiconductor device.

TrenchMOS semiconductor devices are commonly used for power applications. A TrenchMOS device typically includes a semiconductor substrate having a layer of epitaxially grown, doped silicon located thereon, in which is formed a trench containing a gate electrode and gate dielectric. A source region of the device is located adjacent an upper part of the trench. The device also includes a drain region, which is separated from the source region by a body region, through which the trench extends.

Manufacture of TrenchMOS devices generally includes processing the substrate by etching the trench into the layer of epitaxial silicon and by implanting ions to form the source and body regions.

The doping concentration of the layer of epitaxial silicon in which the device is formed is determined during the epitaxial growth process. Conventionally the epitaxial layer has a uniform doping concentration, although it is also known to use epitaxial silicon having a graded doping concentration to reduce the electric fields within the device to reduce the risk of device breakdown and improve long-term reliability. This graded doping concentration is achieved by varying the amount of, e.g. phosphorous per µm as the layer is grown.

SUMMARY

Aspects of the present disclosure are set out in the accompanying independent and dependent claims. Combinations of features from the dependent claims may be combined with features of the independent claims as appropriate and not merely as explicitly set out in the claims.

According to an aspect of the present disclosure, there is provided a semiconductor device comprising:
  a semiconductor substrate having a first conductivity type;
  a layer of doped silicon located on the substrate;
  a trench, extending into the layer of silicon;
  a gate electrode and gate dielectric located in the trench;
  a drain region;
  a body region having a second conductivity type located adjacent the trench and above the drain region; and
  a source region having the first conductivity type located adjacent the trench and above the body region,
  wherein the layer of doped silicon in a region located beneath the body region includes donor ions and acceptor ions forming a net doping concentration within said region by compensation, and
  wherein the net doping concentration of the layer of doped silicon as a function of depth has a minimum in a region located immediately beneath the body region.

According to another aspect of the present disclosure, there is provided a method of making a semiconductor device, the method comprising:
  providing a semiconductor substrate having a first conductivity type, the substrate having thereon a layer of doped silicon having the first conductivity type;
  implanting ions into the layer of silicon, wherein the ions are of a type for doping the layer of silicon to have a second conductivity type, wherein the implanted ions produce a non-constant net doping concentration within the layer of silicon as a function of depth by compensation;
  forming a trench extending into the layer of silicon;
  forming a gate dielectric in the trench;
  forming a gate electrode in the trench;
  implanting ions into the layer of doped silicon to form a body region of the device adjacent the trench, wherein the body region has the second conductivity type and is located above a drain region of the device; and
  implanting ions into the layer of doped silicon to form a source region of the device adjacent the trench and above the body region, wherein the source region has the first conductivity type,
  wherein, after forming the body region and the source region, the net doping concentration of the layer of doped silicon as a function of depth has a minimum in a region located immediately beneath the body region.

In a semiconductor device according to the present disclosure, the net doping concentration of the layer of doped silicon as a function of depth has a minimum in a region located immediately beneath the body region of the device. This may allow the electric fields within the device (e.g. near the junctions thereof and/or near the gate dielectric) to be reduced. These reduced electric fields within the device may, for a given applied voltage, increase the breakdown voltage (BVdss) of the device and may improve long term reliability.

In contrast to the use of silicon having a graded doping profile formed during epitaxial growth as noted above, the net doping concentration in a device according to the present disclosure is formed by compensation of donor ions and acceptor ions within the layer. This may be achieved by implanting ions into a doped epitaxial layer to tailor the net doping concentration within the layer. The implanted ions are of a type for doping the layer of silicon to have a conductivity type different type (e.g. where the layer is initially n-type, p-type ions such as Boron may be implanted).

Since ion implantation can produce doping profiles having narrower tolerances than may be achieved by epitaxy, the ability to tailor the net doping concentration of the layer of silicon according to the other parameters of the device (e.g. the layout (physical dimensions) of the device and the doping concentrations of features such as the body region) may be enhanced.

In some examples, the implantation of the ions of a type for doping the layer of silicon to have a second conductivity type may include more than one implantation. Multiple implantations, each implantation having a different dose or energy may be used to achieve the desired profile.

The net doping concentration of the layer of silicon as a function of depth in the region located beneath the body region may increase with increasing depth beneath the minimum. This can provide an improved balanced level of BVdss and Rdson in the device (where BVdss is the breakdown voltage of the device and Rdson is the on-state resistance of the device).

The gate electrode may extend deeper beneath a surface of the layer of doped silicon than the body region.

The device may further include a reduced surface field (RESURF) electrode in the trench. The reduced surface field electrode may be connected to the source region. The aforementioned improvement in BVdss-Rdson performance is particularly applicable in the case of devices including RESURF structures.

The first conductivity type may be n-type and the second conductivity type may be p-type. In such examples, the layer of doped silicon located on the substrate may initially be doped with phosphorus and the implanted acceptor ions comprise may Boron. The dose and energy of the implant may be tailored according to the specifics of the device layout and doping levels as noted above. Where Boron is used, the Boron ions may be implanted with an energy in the range 1.5 MeV to 2 MeV.

It is also envisaged that the first conductivity type may be p-type and the second conductivity type may be n-type. In such examples, the layer of doped silicon located on the substrate may initially be doped using Boron, and the implanted ions of a type for doping the layer of silicon to have the second conductivity type may be phosphorus.

The layer of doped silicon on the semiconductor substrate, into which the ions are implanted to produce the non-constant net doping concentration, may be substantially uniformly doped. The substantially uniformly doped layer may, for instance, be a uniformly doped epitaxial layer. Thus, the substrates used to manufacture a device according to this disclosure may be relatively cheaply sourced, but the process (i.e. ion implantation) used to produce the non-constant net doping concentration may allow for relatively tight tolerances as noted above.

The layer of doped silicon may have a cap layer located thereon, the cap layer being lower doped than the underlying layer of doped silicon. The thickness of the cap layer may be chosen to ensure that that the bottom of the gate electrode in the trench isn't subjected to high electric fields during use. The cap layer, if thick enough, reduces the net doping at this point in the structure. If the cap is too thick, Rdson can become too high.

According to another aspect of the present disclosure, there is, provided a power amplifier comprising a semiconductor device of the kind described above.

According to a further aspect of the present disclosure, there is provided a switched mode power supply comprising a semiconductor device of the kind described above.

BRIEF DESCRIPTION OF THE DRAWINGS

Embodiments of this disclosure will be described hereinafter, by way of example only, with reference to the accompanying drawings in which like reference signs relate to like elements and in which.

DETAILED DESCRIPTION

Embodiments of this disclosure are described in the following with reference to the accompanying drawings.

In the following examples, the semiconductor device of the present disclosure is an nMOS device in which the first conductivity type is n-type and the second conductivity type is p-type. It will be appreciated however that in some embodiments the semiconductor device may be a pMOS device in which the first conductivity type is p-type and the second conductivity type is n-type.

Figure 1:
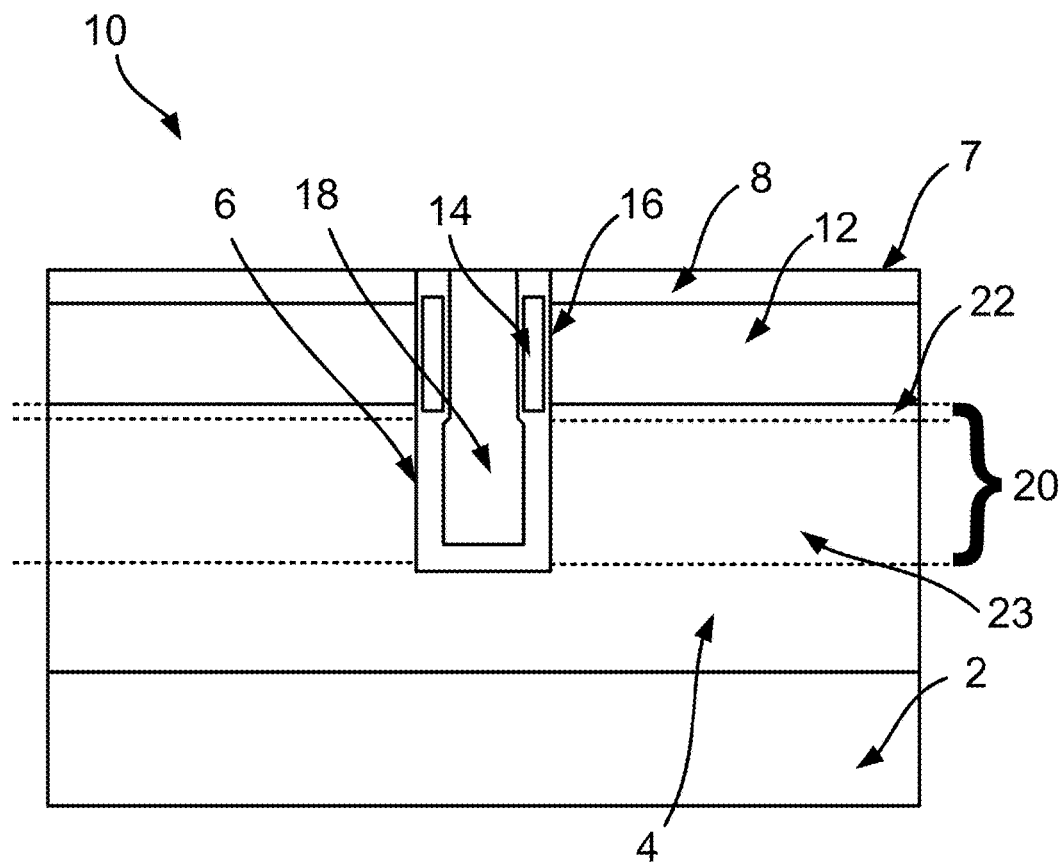
FIG. 1 shows a semiconductor device according to an embodiment of this disclosure.

FIG. 1 shows a semiconductor device 10 according to an embodiment of the present disclosure. The device includes a semiconductor (e.g. silicon) substrate 2. The substrate 2 has a first conductivity type, which in the present example is n-type. The substrate 2 may be doped to have the first conductivity type using, for example, phosphorous or arsenic.

The device 10 includes a layer 4 of doped silicon located on the substrate 2. The layer 4 may include various dopants as will be described in more detail below. The layer 4 may, for example, be epitaxially grown on a major surface of the substrate 2. Various features of the semiconductor device 10 may be provided in the layer 4 as will be described below.

In this example the semiconductor device 10 comprises a trench field effect transistor (TrenchFET). The device 10 includes a trench 6, which extends downwardly into the layer 4 of silicon from a major surface 7 of the layer 4. For clarity, only a single trench is shown in FIG. 1, although it will be appreciated that the trench 6 may be part of a network of trenches of the device 10. The layout of TrenchFET devices of this kind is well known in the art and will not be described here further.

A number of features are located within the trench 6. In particular, the trench has a gate electrode 14 located therein. A gate dielectric 16 is also provided within the trench 6. The gate dielectric 16 lines the sides of the trench 6 to isolate the gate electrode 14 from the source, drain and body regions described below. In this embodiment, a reduced surface field effect (RESURF) plate 18 is also located within the trench 6. The RESURF plate 18 in this example is connected to the source of the device (see below). Note that the RESURF plate 18 is isolated from the edges of the trench 6 by dielectric 16 which may also extend beneath the gate electrode 14. This dielectric also isolates the RESURF plate 18 from the gate electrode 14. In this example, the RESURF electrode 18 extends deeper into the trench than the gate electrode 14 so as to allow field shaping at depths deeper than the body region (see below).

The device 10 also includes a source region 8. The source region 8 has the first conductivity type (in this example, n-type). The source region 8 is located adjacent the trench 6, at or near to the top of the trench 6 (e.g. immediately beneath the major surface 7).

The source region 8 is located above a body region 12 of the device 10. The body region 12 has a second conductivity type (in this example, p-type). The body region 12 is located at a depth beneath the major surface 7 that corresponds to the depth of the gate electrode 14, so that a potential applied to the gate electrode 14 can create an inversion layer within the body region 12 during operation of the TrenchFET. Note that the gate dielectric 16 located in the trench 6 isolates the gate electrode 14 from the body region 12. The body region 12 is located above a drain region of the device 10. The drain region in this example comprises that part of the layer 4 that is provided beneath the body region 12. Note that in this example, the trench 6 extends partially into the drain region.

In the present embodiment, the gate electrode 14 extends deeper beneath the major surface 7 than does the body region 12. Note that the gate electrode 14 also extends to a slightly shallower level above the body region 12 adjacent the source 8. Accordingly, the gate electrode 14 slightly overlaps with the source 8 and the region 20 (corresponding to the drain). This can ensure that a potential applied to the gate electrode 14 can form an inversion region within the body region 12 that extends the full depth of the body region 12, for switching on the transistor.

A region 20 of the layer 4 of silicon located beneath the body region 12 includes donor ions and acceptor ions for forming a net doping concentration within the region 20. As will be described below, the region 20 located beneath the body region 12 may be formed from a part of the semiconductor layer 4 which may initially be doped during manufacture to have the first conductivity type. These dopants may be included within the layer 4 during epitaxial growth of the layer 4. As will also be described in more detail below, the net doping concentration in the region 20 may be modified during manufacture by using ion implantation to implant ions which are of a type for doping the layer of silicon 4 to have the second conductivity type. The implanted ions may be donor ions or acceptor ions, according to whether the layer 4 is initially grown to be n-type (for an nMOS TrenchFET) or p-type (for an pMOS TrenchFET). In the present example (which comprises an nMOS TrenchFET), the layer 4 is initially grown to be n-type doped, and is therefore implanted with acceptor ions such as Boron.

The implanted ions produce a non-constant net doping concentration within the layer of silicon 4 as a function of depth. The region 20 of the semiconductor layer 4 thus includes donor ions (the n-type dopants included in the layer 4 during epitaxial growth) and acceptor ions (implanted as described above) which, by compensation form the non-constant net doping concentration within the region 20. The net doping concentration as a function of depth has a minimum that is located in a part 22 of the region 20 located immediately beneath the body region 12.

The net doping concentration of the layer 4 as a function of depth in the region 20 in this example also increases with increasing depth beneath the region 22 including the minimum in the net doping concentration. The minimum in the net doping concentration in the region 22 located immediately beneath the body region 12, may allow the electric fields within the device 10, in particular, near the junctions of the device 10 and near dielectric 16 to be reduced for a given applied voltage, owing to enhanced depletion. This may in turn increase the breakdown voltage BVdss of the device 10 and may improve the long-term reliability of the device 10.

In accordance with embodiments of this disclosure, in contrast to using epitaxial silicon having a graded doping profile that is formed simply by varying the amount of dopants per μm during epitaxial growth, the net doping concentration in the region 20 of the device 10 is tailored using compensation of donor ions and acceptor ions within the layer 4. Because ion implantation allows for close control over the implanted dose and energy, it follows that close control over the net doping concentration in the region 20 may be achieved. This may, for instance, allow for accurate positioning of the minimum in the region 22 located immediately beneath the body region 12 and/or may allow precise tailoring of the increasing doping concentration within the region 20 beneath the minimum in the region 22 as a function of depth.

Note that ion implantation can produce doping profiles having narrower tolerances than may be achieved during epitaxial growth and thus the ability to tailor the net doping concentration in a device according to an embodiment of this disclosure may be enhanced. Notwithstanding this, and as described in more detail below, the semiconductor layer 4 may initially be grown and doped to have the first conductivity type using epitaxy. Accordingly, in accordance with embodiments of this disclosure, well controlled ion implantation techniques can be used to define the final net doping concentrations within the semiconductor device, notwithstanding the fact that the initial substrates used to make the device may be epitaxially grown.

An example of a manufacturing process for manufacturing a device of the kind described in relation to FIG. 1 will now be described in relation to FIGS. 2-8.

In a first step of the method, there is provided a semiconductor substrate that has a first conductivity type. As noted above, in the present example the substrate is a silicon substrate that is n-type doped, although it is envisaged that other kinds of substrate (for instance p-type doped substrates) may be used.

The substrate has a layer of doped silicon provided thereon. The layer of doped silicon has the first conductivity type (and thus is of the same conductivity type as the substrate upon which it is provided). The layer may be epitaxially grown and the n-type doping of the layer may be included as part of the epitaxial growth process as noted above.

Figure 2:
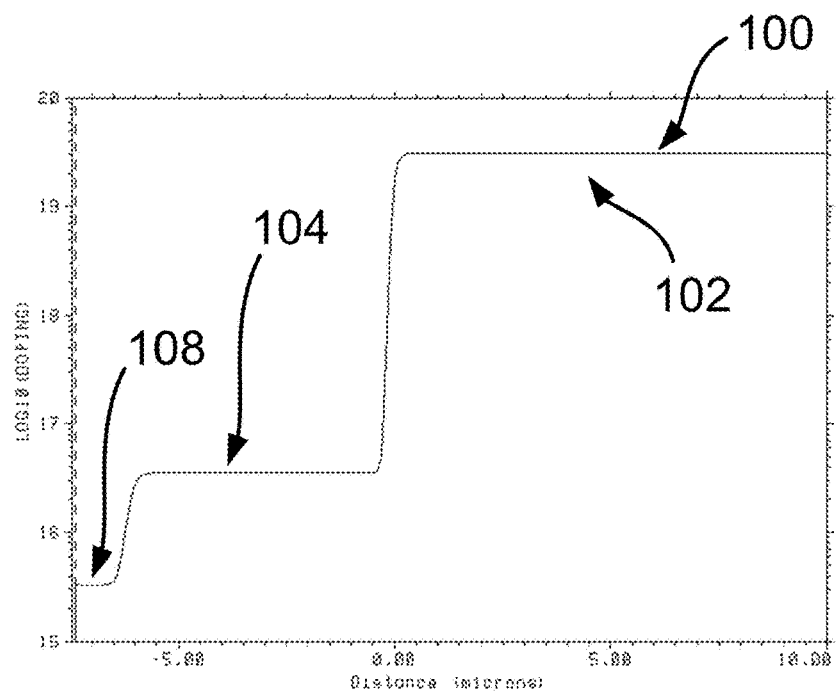
FIGS. 2, 3, 5, 6 and 8 show doping concentrations as a function of depth during manufacture of a semiconductor device according to an embodiment of this disclosure.

FIG. 2 shows the net doping concentration 100 of the substrate and the epitaxial layer located thereon as a function of depth beneath the major surface of the epitaxial layer. The region 102 in FIG. 2 corresponds to the doping concentration in the semiconductor substrate, while the region 104 in FIG. 2 corresponds to the doping concentration in the epitaxial layer. FIG. 2 shows a further region 108, which corresponds to a cap layer that is optionally provided at the top of the epitaxial layer. The cap layer may be a relatively lightly doped (and relatively high resistance) part of the epitaxial layer. Alternatively the cap layer may be provided as a separate layer on top of the epitaxial layer.

As can be seen from FIG. 2, the doping concentrations within the substrate and within the epitaxial layer are approximately constant as a function of depth, although the doping concentration in the epitaxial layer is somewhat lower (in this example, about three orders of magnitude lower) than that in the substrate. The doping concentration within the cap layer, indicated by the region 108 in FIG. 2, is substantially lower (in this example about an order of magnitude lower) than the doping concentration in the region 104 corresponding to the epitaxial layer.

As described herein, a number of ion implantation steps may be used to modify the doping concentrations and conductivity types of various parts of the epitaxial layer. Prior to the implantation steps, screen oxides may, be provided at the surface of the epitaxial layer to prevent ingress of impurities into the epitaxial layer, as is known in the art.

In a first implantation step, ions are implanted into the layer of silicon that are of a type for doping the layer of silicon to have the second conductivity type. In the present example, as noted above, the first conductivity type is n-type, while the second conductivity type is p-type. In this example therefore, the ions implanted during this implantation step of the method are acceptor ions (e.g. Boron ions). The dose of the Boron ion implantation may be in the range $3 \times 10^{12}$ cm$^{-2}$ to $7 \times 10^{12}$ cm$^{-2}$, with an energy in the range 1.5 MeV to 2.0 MeV, depending upon the desired BVdss for the final device.

Figure 3:
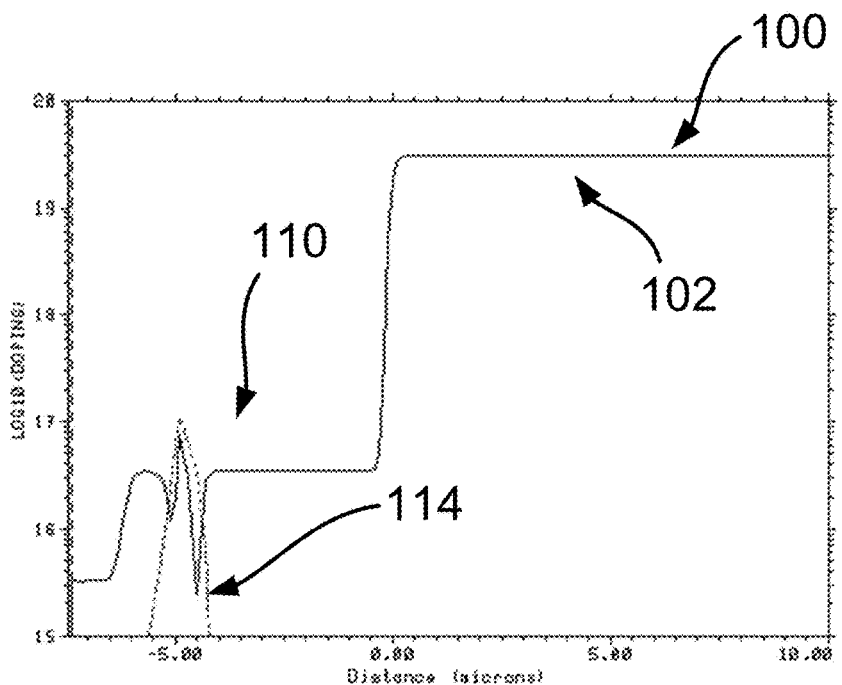

The doping concentration of the Boron implant is shown as a function of depth in FIG. 3 by the dotted line labelled 114. The ions are implanted at a depth that corresponds generally to the depth at which the body region and the region (see the region 20 in FIG. 1) beneath the body will be situated in the finished device. This allows the doping concentration within these regions to body tailored as described further below.

In FIG. 3, reference numeral 110 is used to denote the region comprising the epitaxially grown layer including the cap layer (which is optional). Note that the implantation of the Boron ions modifies the net doping concentration of the silicon layer in this region. As explained above, the ions implanted in this step are of the opposite conductivity type to the conductivity type of the epitaxially grown layer (which, in the present example, may initially be doped during epitaxial growth using, e.g. phosphorus). This causes compensation of acceptor and donor ions to occur within the region in which the Boron (acceptor) ions are implanted, resulting in the modified net doping concentration shown in FIG. 3.

As noted above, the first conductivity type may, in some examples, be p-type. In such examples, the epitaxially grown layer may initially be doped during epitaxial growth using, e.g. Boron and the implantation step described in relation to FIG. 3 may instead comprise the implantation of donor ions such as Phosphorus.

After the implantation step described above, the features of the trench of a TrenchFET may be processed. These parts of the manufacturing method may be substantially conventional and may, for example, include the etching of a trench extending into the layer of silicon and the formation of a gate dielectric and gate electrode within the trench. Also, an optional reduced surface field effect (RESURF) electrode may be provided within the trench as already described above in relation to FIG. 1. An example of the resulting arrangement is shown in FIG. 4, which includes a depth scale which may be compared with the x-axis of FIG. 3.

Figure 4:
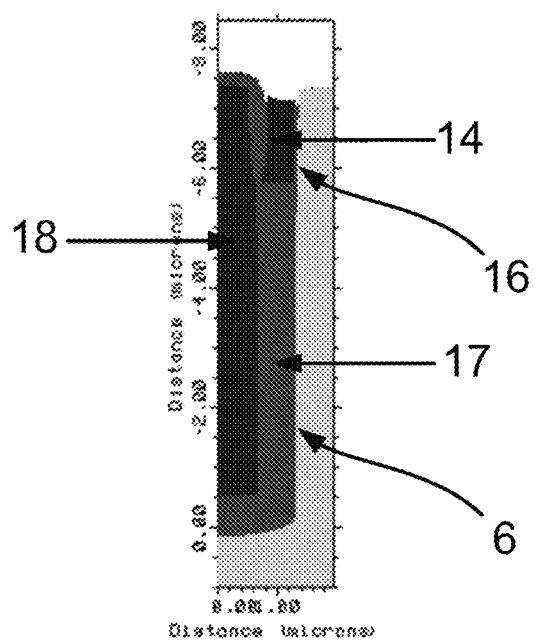
FIG. 4 shows the formation of a trench containing a gate dielectric and gate electrode according to, an embodiment of this disclosure.

FIG. 4 shows that the trench 6 includes a dielectric 17 for isolating the RESURF electrode and a gate dielectric 16 that separates the gate electrode 14 from the edge of the trench. Note that the relatively thin gate oxide 14 may be grown at the edges of the trench in a separate step to the deposition of the relatively thick oxide 17 that is used to isolate the RESURF electrode 18. The difference in thickness of the oxide 17 and the oxide 16 may cause relatively high electric fields to arise close to the lower edge of the gate. This may be addressed using the cap layer, as described below. The gate electrode 14, may, for example, comprise polysilicon.

Figure 5:
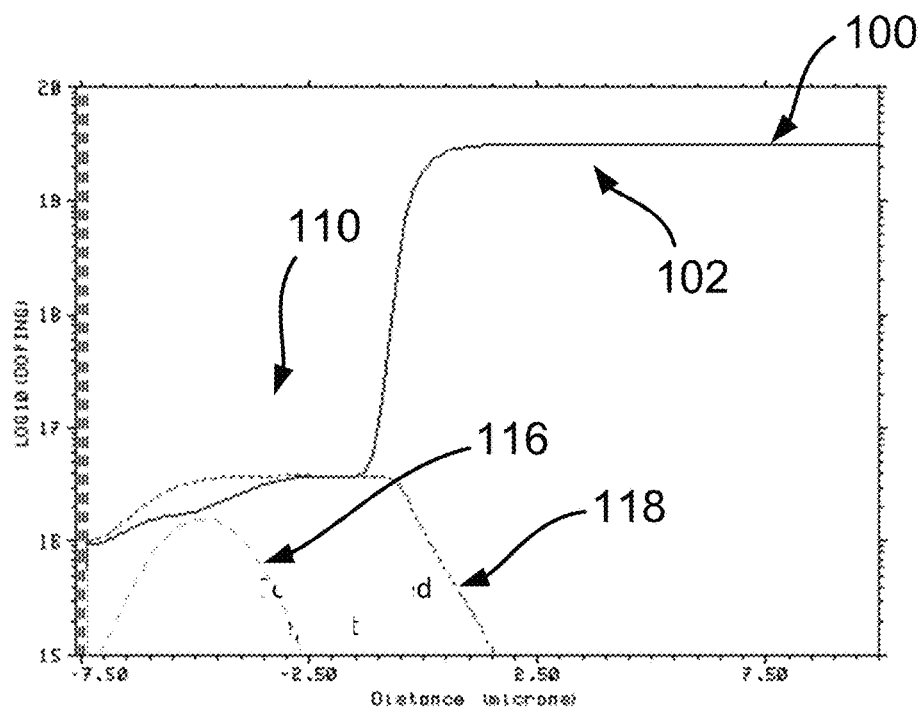

The processing of the features shown in FIG. 4 within the trench 6 involves a certain thermal budget. This thermal budget leads to spreading by diffusion of the dopants within the various parts of the substrate and epitaxial layer described in relation to FIG. 3. The resulting doping concentrations are shown in FIG. 5. The dashed line 116 in FIG. 5 shows the spreading of the implanted Boron acceptor ions, while the dotted line 118 shows the diffusion of the (n-type, e.g. phosphorous) dopants of the epitaxial layer that were included in the epitaxial layer as initially grown. Note that the spreading of the phosphorous ions can cause phosphorous ions from the epitaxial layer to pass into the underlying substrate and can also result in an increased doping level within the optional cap layer which, as noted above, is initially lightly doped. The net doping concentration 100 shown in FIG. 5 shows that at this stage, while the doping concentration within the substrate remains approximately constant as a function of depth, the doping concentration within the epitaxial layer generally increases as a function of depth.

In a next step, which may be preceded by the preparatory deposition of a screen oxide, ions are implanted into the layer of doped silicon to form a body region of the device of the kind described above in relation to FIG. 1. Since the body region is of the second conductivity type, the implanted ions in this example are acceptor ions (e.g. Boron ions). The ions may be implanted with one or more discrete intended energies and different doses for each energy to obtain an improved profile.

Figure 6:
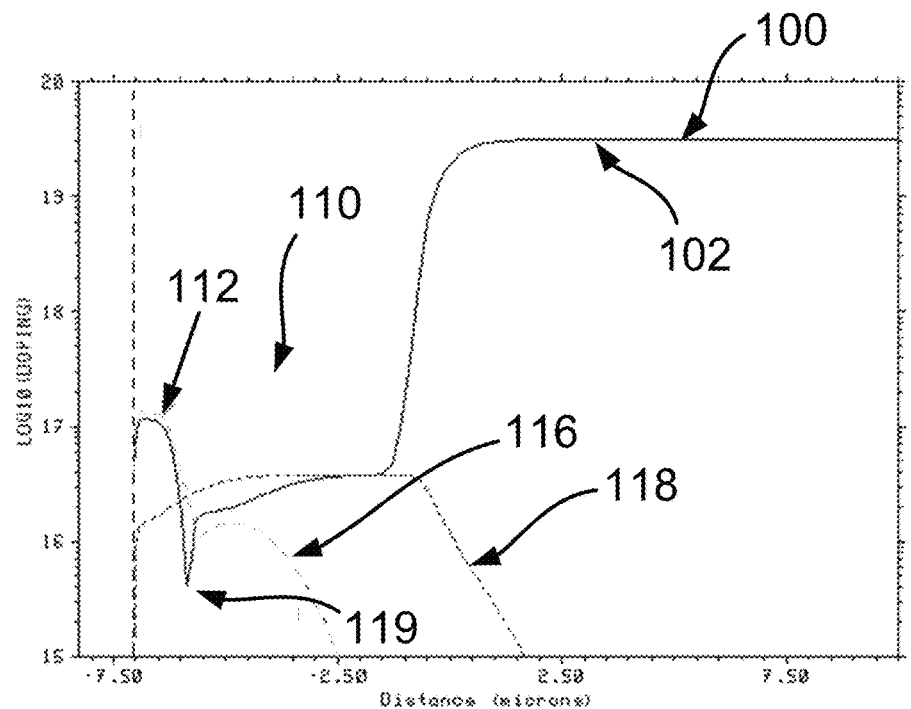

The combined doping concentration of the previously implanted Boron ions and the currently implanted Boron ions for forming the body region is shown by a dashed line in FIG. 6 (for this dashed line, reference numeral 112 corresponds to the body region of the device, while reference numeral 116 corresponds to the region located beneath the body region). Again, reference numeral 118 shows the doping concentration of the n-type ions included during growth of the epitaxial layer. Once again, reference numeral 100 denotes the net doping concentration within the substrate and the epitaxial layer, factoring in the initial n-type dopants in the silicon substrate and epitaxial layer as well as the implanted acceptor ions described above. Note that the net doping concentration indicated by the line 100 includes a minimum positioned immediately beneath the body region of the device (this minimum is denoted in FIGS. 6 and 8 using reference numeral 119). The minimum 119 arises from the combination of acceptor ions implanted during the first implantation step, described above in relation to FIG. 3 and during the implantation step for forming the body region. In particular, note that the minimum 119 forms as a consequence of compensation of these acceptor ions with the donor ions (in this example phosphorous ions) included in the epitaxial silicon layer as grown.

Figure 7:
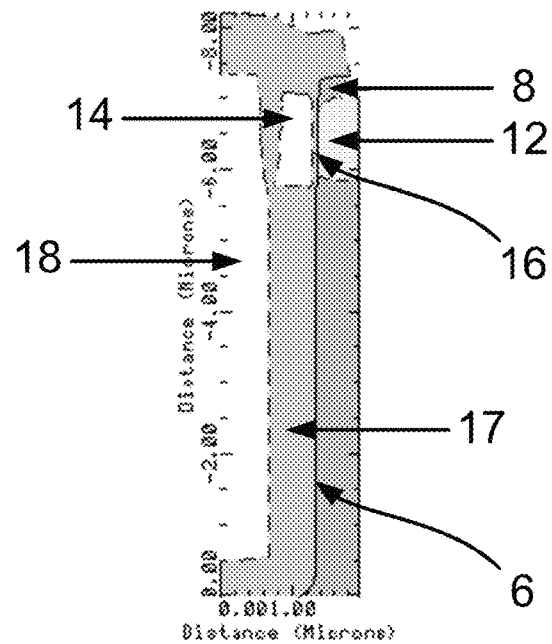
FIG. 7 shows the formation of a body region and a source region according to an embodiment of this disclosure.

In a next step, a further implantation of ions can be performed to form a source region 8 of the device as shown in FIG. 7. The source region 8 is, as already explained above in relation to FIG. 1, located adjacent the trench 6, above the body region 12. The ions implanted for forming the source region are of the first conductivity type (in this example, n-type, e.g. arsenic ions). After the implantation of the ions for forming the source region, back end processing of the device may be carried out.

Figure 8:
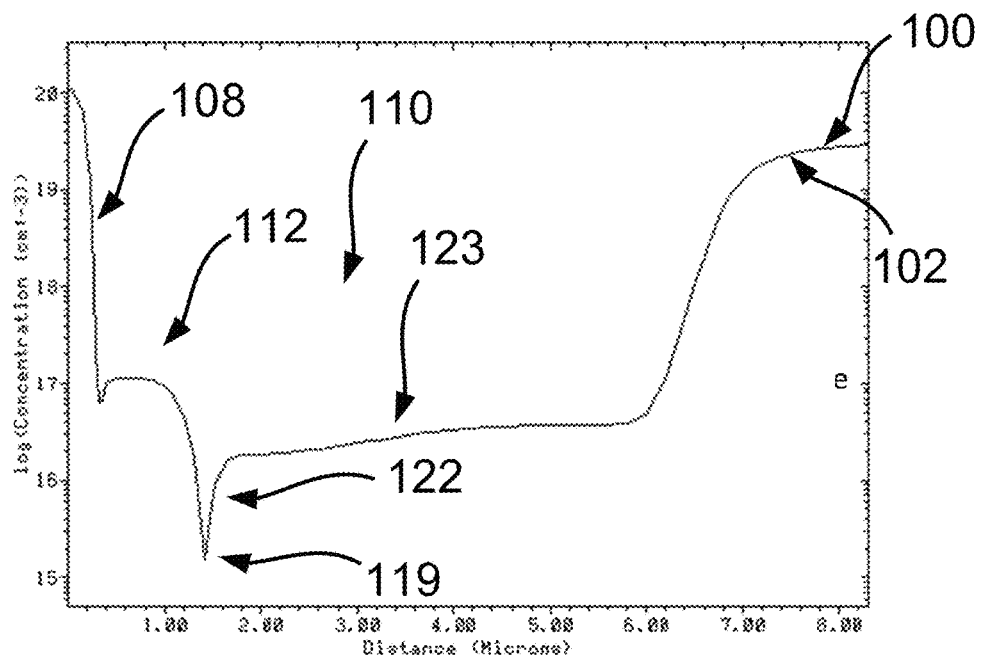

The net doping concentration 100 as a function of depth within the finished device is illustrated in FIG. 8. In FIG. 8, the region 108 corresponds to the doping concentration within the source region, the region 112 corresponds to the doping concentration within the body region and the doping concentrations at 122, 123 correspond to the region located beneath the body region. Again, reference numeral 102 denotes the doping concentration within the underlying substrate. Note that the net doping concentration within the finished device includes the minimum 119 described above, in the region located immediately beneath the body region. The net doping concentration also increases as a function of depth below this minimum 119 (see reference numeral 123).

Figure 9:
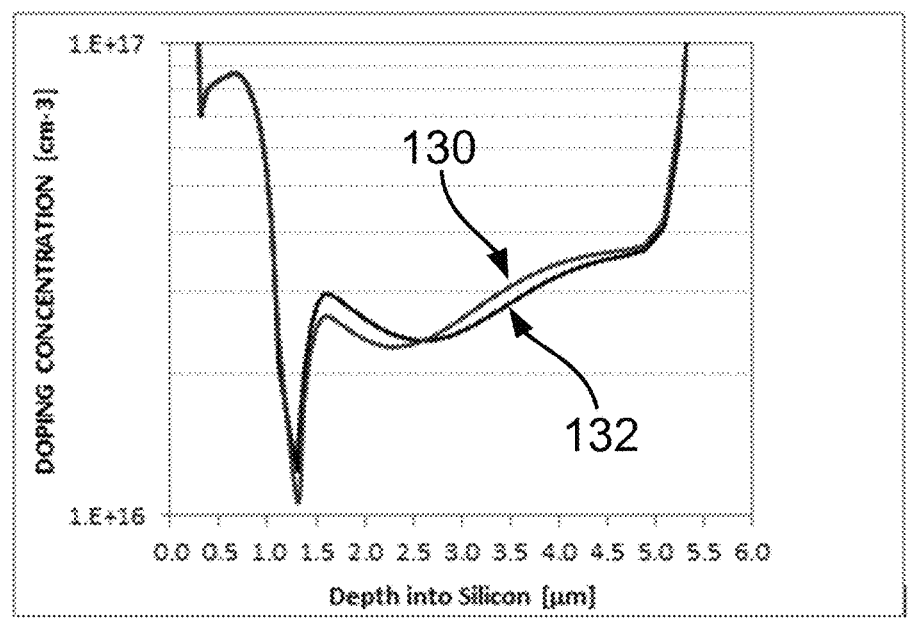
FIG. 9 simulates the effect of altering an implant energy of implanted Boron ions on the net doping concentration in a device according to an embodiment of this disclosure.

The net doping concentration within the finished device can be varied by varying the parameters of the implantation described above in relation to FIG. 3. This is illustrated in FIG. 9, which shows the net doping concentration within the device as a function of depth, where the implantation energy of the implantation step described above in relation to FIG. 3 was 2.0 MeV (indicated by reference numeral 132) and where the implantation energy was 1.7 MeV (indicated by reference numeral 130). Accordingly, the doping concentration at the minimum located immediately beneath the body region of the device can be varied by varying the implantation energy, as can the line shape of the net doping concentration located beneath the minimum.

Thus, by adjusting the parameters of the implantation step described above in relation to FIG. 3, the final net doping concentration within the device can be tailored according to the desired parameters of the device such as the breakdown voltage BVdss and the on-resistance (Rdson) of the device.

Figure 10:
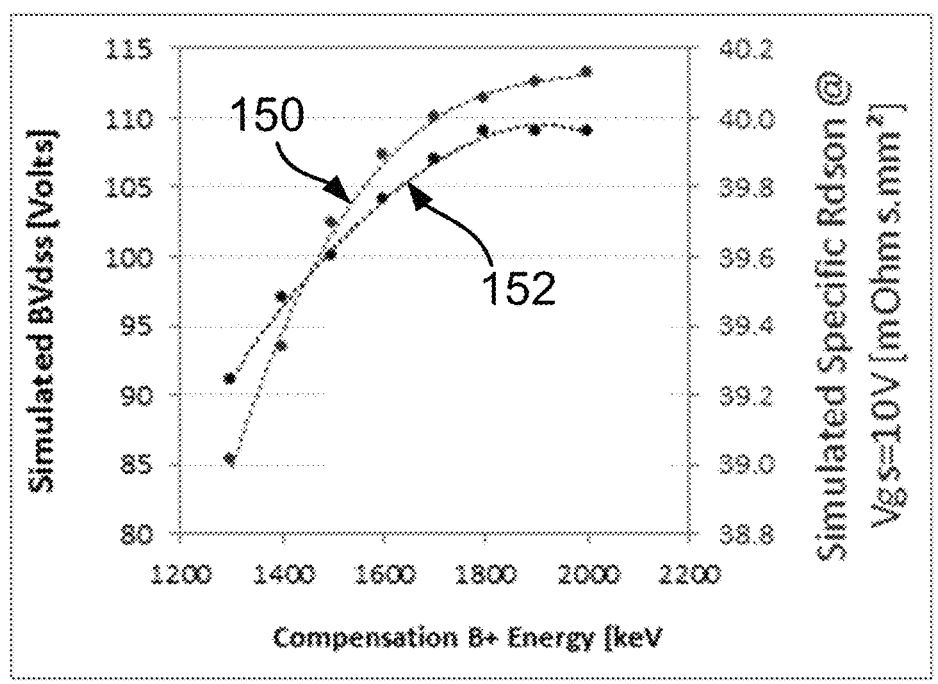
FIG. 10 simulates BVdss and Rspec of a device according to an embodiment of this disclosure as a function of implanted Boron energy.

FIG. 10 shows the results of simulations of the breakdown voltage BVdss (plot 152) and the specific on-state resistance Rdson (plot 150) of a device in accordance with an embodiment of this disclosure as a function of the energy of the ions implanted in the implantation step of FIG. 3. These were simulations were performed with a gate-source voltage of Vgs=10V. For these simulations, the epitaxial layer had an initial doping concentration of $3.5 \times 10^{16}$ cm$^{-3}$, and a thickness of 6.6 µm. The dosage of the Boron implant was $5 \times 10^{12}$ cm$^{-2}$. The depth of the trench was 6.2 µm.

As can be seen from FIG. 10, there is a tradeoff between the breakdown voltage BVdss and the specific Rdson resistance. FIG. 10 illustrates that by adjusting the parameters (implant energy, dose) for the implantation step described above in relation to FIG. 3, a desired value of BVdss and/or Rdson can be selected. FIG. 10 also shows that, in this example, the optimal implantation energy for the Boron ions is around 1.8 MeV, at which the value of BVdss plateaus.

A device of the kind described herein may, for instance, be provided in a power amplifier or a switched mode power supply. Applications include laptop power supplies, telecoms infrastructure and motor drives.

Accordingly, there has been described a semiconductor device and a method of making a semiconductor device. The device includes a semiconductor substrate having a first conductivity type, a layer of doped silicon located on the substrate, a trench extending into the layer of silicon, and a gate electrode and gate dielectric located in the trench. The device also includes a drain region, a body region having a second conductivity type located adjacent the trench and above the drain region, and a source region having the first conductivity type located adjacent the trench and above the body region. The layer of doped silicon in a region located beneath the body region includes donor ions and acceptor ions forming a net doping concentration within said region by compensation. The net doping concentration of the layer of doped silicon as a function of depth has a minimum in a region located immediately beneath the body region.

Although particular embodiments of this disclosure have been described, it will be appreciated that many modifications/additions and/or substitutions may be made within the scope of the claims.

The invention claimed is:

1. A semiconductor device comprising:
a semiconductor substrate having a first conductivity type;
a layer of doped silicon located on the substrate;
a trench extending into the layer of silicon;
a gate electrode and gate dielectric located in the trench;
a drain region;
a body region having a second conductivity type located adjacent the trench and above the drain region; and
a source region having the first conductivity type located adjacent the trench and above the body region,
wherein the layer of doped silicon in a region located beneath the body region includes donor ions and acceptor ions forming a net doping concentration within the region beneath the body region by compensation,
wherein the net doping concentration of the layer of doped silicon as a function of depth has a minimum for the entire semiconductor device in the region located immediately beneath the body region, and
a cap layer located at a top of the layer of doped silicon and beneath the body region and the cap layer is lower doped than the layer of doped silicon beneath the cap layer.

2. The device of claim 1, wherein the net doping concentration of the layer of silicon as a function of depth in the region located beneath the body region increases with increasing depth beneath said minimum.

3. The device of claim 1, wherein the gate electrode extends deeper beneath a surface of the layer of doped silicon than the body region.

4. The device of claim 1, further comprising a reduced surface field electrode in the trench, wherein the reduced surface field electrode is operatively connected to the source region.

5. The device of claim 1, wherein the first conductivity type is n-type and the second conductivity type is p-type.

6. The device of claim 5, wherein the acceptor ions comprise Boron.

7. A power amplifier comprising a semiconductor device according to claim 1.

8. A switched mode power supply comprising a semiconductor device according to claim 1.

9. The device of claim 1, wherein the cap layer is a part of the layer of doped silicon.

* * * * *

UNITED STATES PATENT AND TRADEMARK OFFICE
CERTIFICATE OF CORRECTION

PATENT NO. : 10,153,365 B2  
APPLICATION NO. : 15/233834  
DATED : December 11, 2018  
INVENTOR(S) : Steven Thomas Peake et al.

Page 1 of 1

It is certified that error appears in the above-identified patent and that said Letters Patent is hereby corrected as shown below:

On the Title Page

Under "Applicant", Item (71) - please correct: "AB Nijmegen" to -- Nijmegen --

Signed and Sealed this
Twelfth Day of February, 2019

Andrei Iancu
*Director of the United States Patent and Trademark Office*